United States Patent
Gammel et al.

(10) Patent No.: US 7,723,706 B2
(45) Date of Patent: May 25, 2010

(54) HORIZONTAL AND VERTICAL BEAM ANGLE MEASUREMENT TECHNIQUE

(75) Inventors: George Michael Gammel, Marblehead, MA (US); Peter Kellerman, Essex, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 211 days.

(21) Appl. No.: 12/142,553

(22) Filed: Jun. 19, 2008

(65) Prior Publication Data
US 2009/0314959 A1    Dec. 24, 2009

(51) Int. Cl.
*H01J 37/317* (2006.01)
*H01J 37/244* (2006.01)

(52) U.S. Cl. .................. 250/492.21; 250/397
(58) Field of Classification Search ............ 250/492.21, 250/397
See application file for complete search history.

(56) References Cited

U.S. PATENT DOCUMENTS

| | | | | |
|---|---|---|---|---|
| 4,517,462 A | * | 5/1985 | Boyer et al. ................. | 250/397 |
| 5,814,823 A | * | 9/1998 | Benveniste ............. | 250/492.21 |
| 6,677,598 B1 | * | 1/2004 | Benveniste ............. | 250/492.21 |
| 7,026,628 B2 | * | 4/2006 | Krueger ...................... | 250/397 |
| 7,663,125 B2 | * | 2/2010 | Callahan et al. ........ | 250/492.21 |
| 2004/0149926 A1 | * | 8/2004 | Purser et al. ................. | 250/397 |

* cited by examiner

*Primary Examiner*—Jack I Berman (57) ABSTRACT

A system and method of quickly determining the parameters of an ion beam are disclosed. An ion beam, having a width and height dimension, is made up of a number of individual beamlets. By using a plurality of detectors, deployed over the entire beam, it is possible to quickly determine the mean angle of the beam at various locations. This information can then be used to adjust the beamline components. The detector allows a small portion of the beam to enter through a narrow slit. Varying voltages are applied to a set of electrostatic deflection plates, which enable rapid determination of the incoming beam angle. By positioning a plurality of these detectors along one or both dimensions of an ion beam, a profile of the beam can be quickly generated. This profile can then be used to adjust the various beam line components so as to improve the spread of the ion beam. This adjustment can either be made manually, or via an automated controller.

18 Claims, 8 Drawing Sheets

HORIZONTAL AND VERTICAL BEAM ANGLE MEASUREMENT TECHNIQUE

BACKGROUND OF THE INVENTION

Ion implanters are commonly used in the production of semiconductor wafers. An ion source is used to create a beam of positively charged ions, which is then directed toward the workpiece. As the ions strike the workpiece, they change the properties of the workpiece in the area of impact. This change allows that particular region of the workpiece to be properly "doped". The configuration of doped regions defines the functionality of the workpiece, and through the use of conductive interconnects, these workpieces can be transformed into complex circuits.

Figure 1:
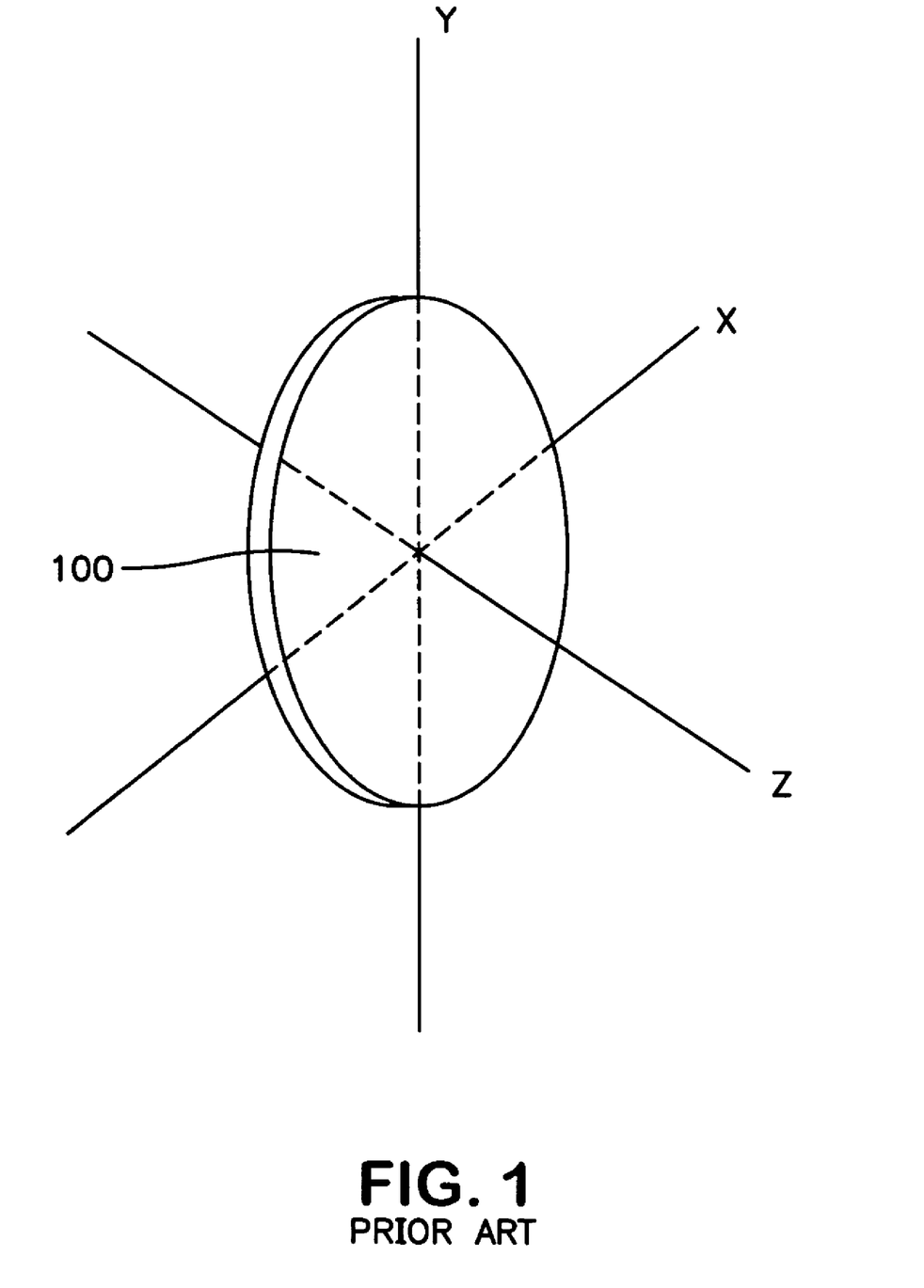
FIG. 1 shows a coordinate system used to describe the orientation of a semiconductor workpiece.
Figure 2A:
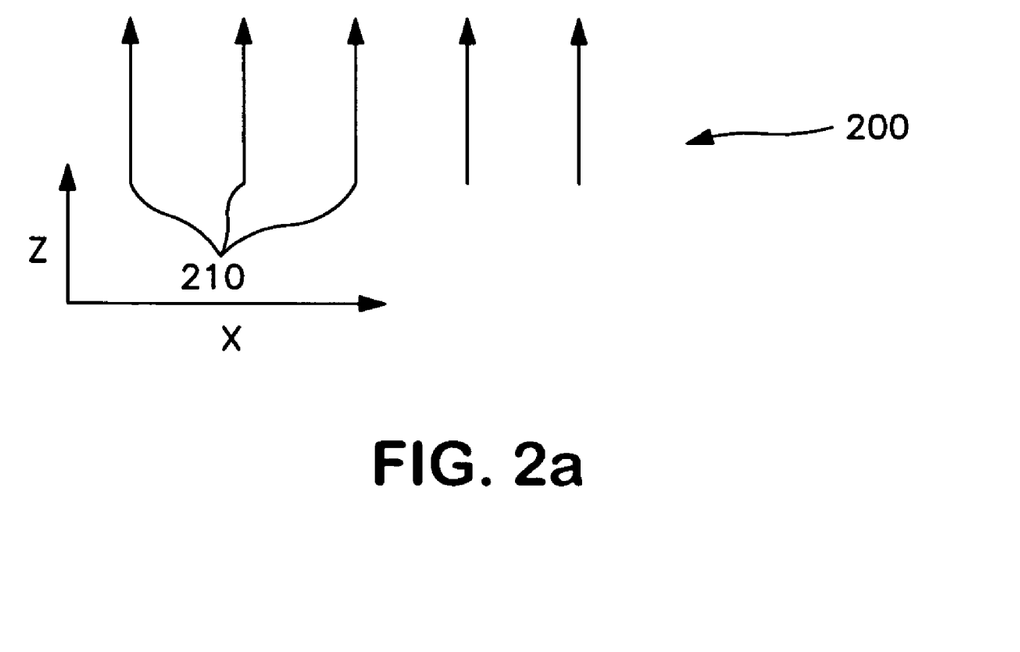
FIG. 2a shows a representation of an ion beam, comprising a number of ion beamlets.
Figure 2B:
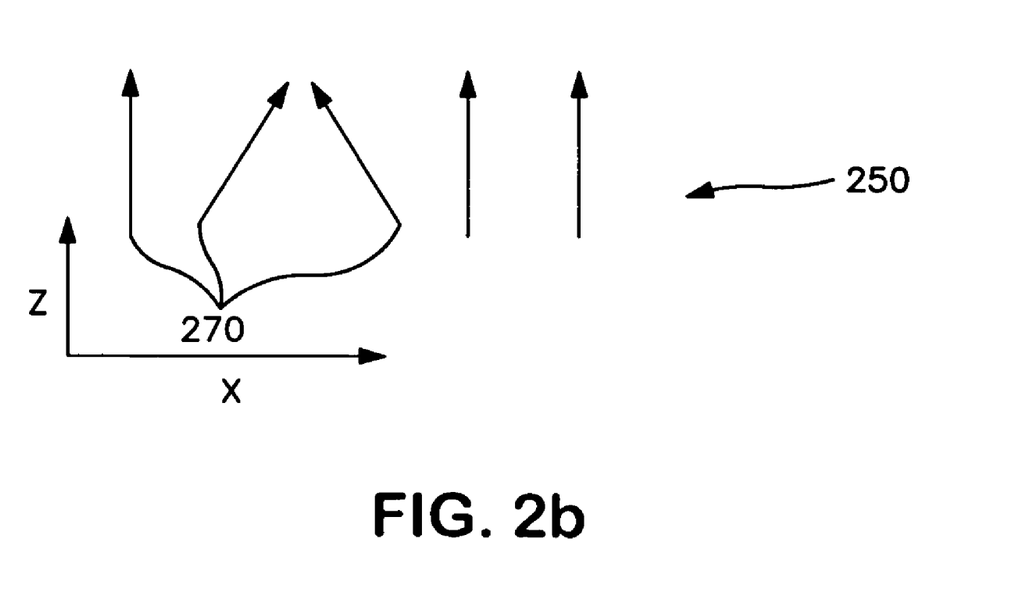
FIG. 2b shows a second representation of an ion beam comprising a number of ion beamlets.

In many applications, the ion beam is directed so as to strike the workpiece in a direction normal to the plane of the workpiece. FIG. 1 shows a representative orientation of workpiece 100 in three dimensions, X, Y and Z. In many applications, the ion beam (not shown) is directed toward the workpiece 100 in a direction substantially parallel to the Z axis. In this manner, the ion beam is substantially perpendicular to the workpiece in both the X and Y axes. The ion beam can be thought of as a set of ion beamlets, each beamlet comprising a single line in the XZ plane. While it is important that the entire beam is substantially perpendicular to the workpiece, it is equally important that each of the individual beamlets is also perpendicular to the workpiece in both the X and Y axes. FIG. 2a shows an ion beam 200 which is made up of a plurality of beamlets 210. Although only several are shown for purposes of illustration, the ion beam can be comprised of an arbitrary number of beamlets. In this Figure, all of the beamlets 210 are parallel to one another. In contrast, FIG. 2b shows an ion beam 250, which is also substantially perpendicular to the workpiece. However, its component ion beamlets 270 are not parallel to one another, and consequently some of these beamlets are not perpendicular to the workpiece.

Since an ion beam is a three dimensional entity, parallelism exists in several dimensions. For example, ion beamlets can be parallel across the X dimension (i.e. the XZ plane). In this dimension, deviations in the Y dimension are not considered. Similarly, ion beamlets can be parallel across the Y dimension (i.e. YZ plane), where deviations in the X dimension are not considered. It should be obvious to one of ordinary skill in the art that the ion beamlets of an ion beam can display parallelism in one dimension (i.e. width) without displaying parallelism in the orthogonal dimension (i.e. height).

Figure 3:
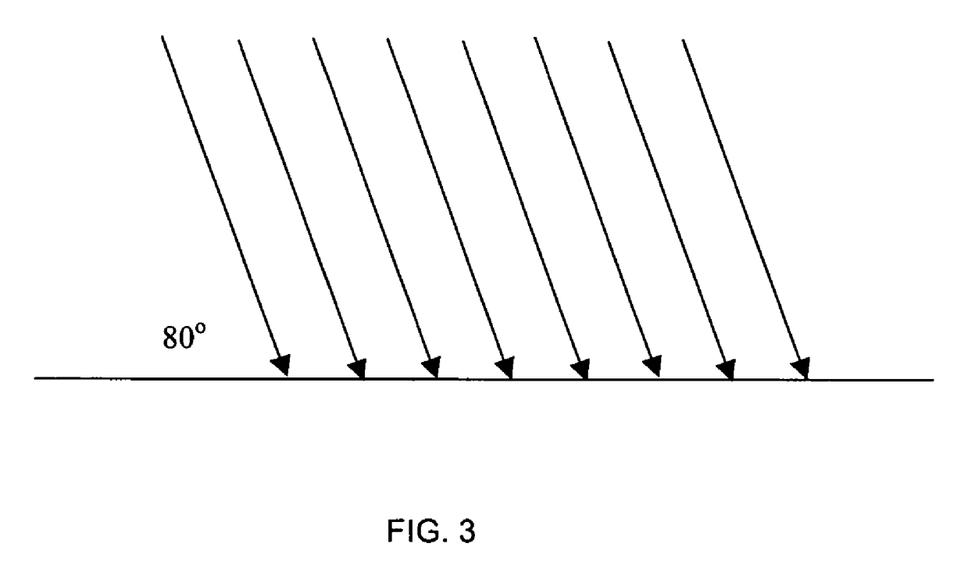
FIG. 3 shows a representation of an ion beam having a first set of divergence and spread parameters.
Figure 4:
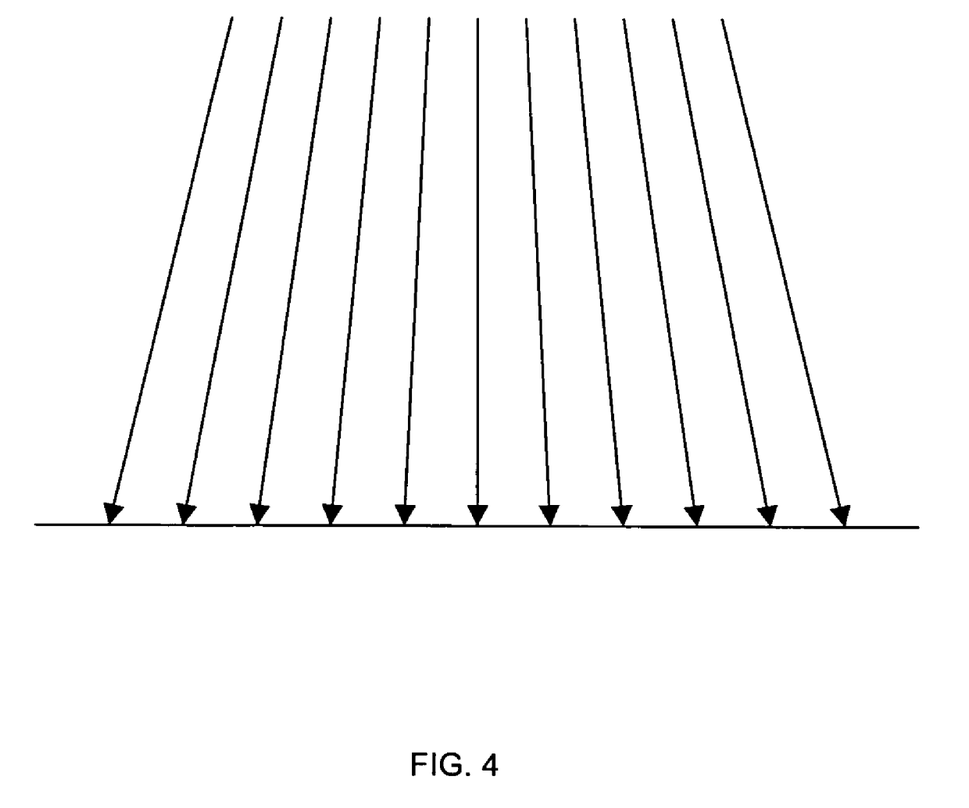
FIG. 4 shows a representation of an ion beam having a second set of divergence and spread parameters.

As geometries continue to shrink, it is critical to be able to measure the orientation of the ion beam, and to control the beam so as to maximize the degree of parallelism. In measuring an ion beam, there are several important parameters. The first is the divergence of the ion beam. As used in this disclosure, the term "divergence" is defined as the mean angle of incident of the ion beam onto the workpiece. This is determined to be the mean of the individual ion beamlet's angles of incidence. The second parameter is "spread", which is defined as the range of these mean angles. These parameters help define the ion beam. For example, FIG. 3 shows an ion beam having a divergence of 10° and a spread of 0°. This low spread value indicates that the individual ion beamlet have a high degree of parallelism. The divergence value indicates that the ion beam is striking the workpiece at an 80° angle, rather than perpendicularly. FIG. 4 shows an ion beam having a divergence of 0° and a spread of 10°. In this case, the ion beam on average strikes the beam perpendicularly, but the angles of incidence of the individual beamlets differ by 10°.

Thus, although the ion beam as an entity is perpendicular to the workpiece, the individual beamlets differ greatly in angular direction. For example, the outermost beamlets in FIG. 4 vary in incidence angle by 10°. It should be noted that it is much easier to compensate for variations in divergence in the ion implantation system than angular spread. In many applications, the workpiece is simply rotated about the Y axis so that the desired mean incident angle is obtained. Angular spread is corrected by adjustments to the beamline components. For example, the mass analysis magnet, the scanner, the correction magnet, D2 focus, the rods and poles, D1 and D2 suppression, and the various quadrupole coils can all be adjusted to vary, and minimize the angular spread of the ion beam.

To perform these adjustments, it is imperative to be able to measure very accurately the incidence angle of the ion beam. Numerous patents disclose apparatus and methods of determining these parameters for an ion beam. Unfortunately, many of the techniques currently used are time consuming and relatively inaccurate. The time required to measure the ion beam negatively impacts the time to calibrate the beam. This hurts the overall system utilization. The inaccuracy of the measuring devices reduces the ability to perfectly control the ion beam as well.

It would be greatly beneficial to be able to measure these ion beam characteristics to within +/−0.1°. It would also be very advantageous if these measurements could be made quickly, so that real time tuning for minimum angle spread is possible.

SUMMARY OF THE INVENTION

The problems of the prior art are overcome with the system and method described in this disclosure. An ion beam, having a width and height dimension, is made up of a number of individual beamlets. These beamlets all act independently, and therefore, the parameters of the ion beam may vary over the dimensions of the beam. By using a plurality of detectors, deployed over the entire beam, it is possible to quickly determine the mean angle of the beam at various locations. This information can then be used to adjust the beamline components.

The detector allows a small portion of the beam to enter through a narrow slit. Varying voltages are applied to a set of electrostatic deflection plates, which enable rapid determination of the incoming beam angle. By positioning a plurality of these detectors along one or both dimensions of an ion beam, a profile of the beam can be quickly generated. This profile can then be used to adjust the various beam line components so as to improve the spread of the ion beam. This adjustment can either be made manually, or via an automated controller.

DETAILED DESCRIPTION

Figure 5:
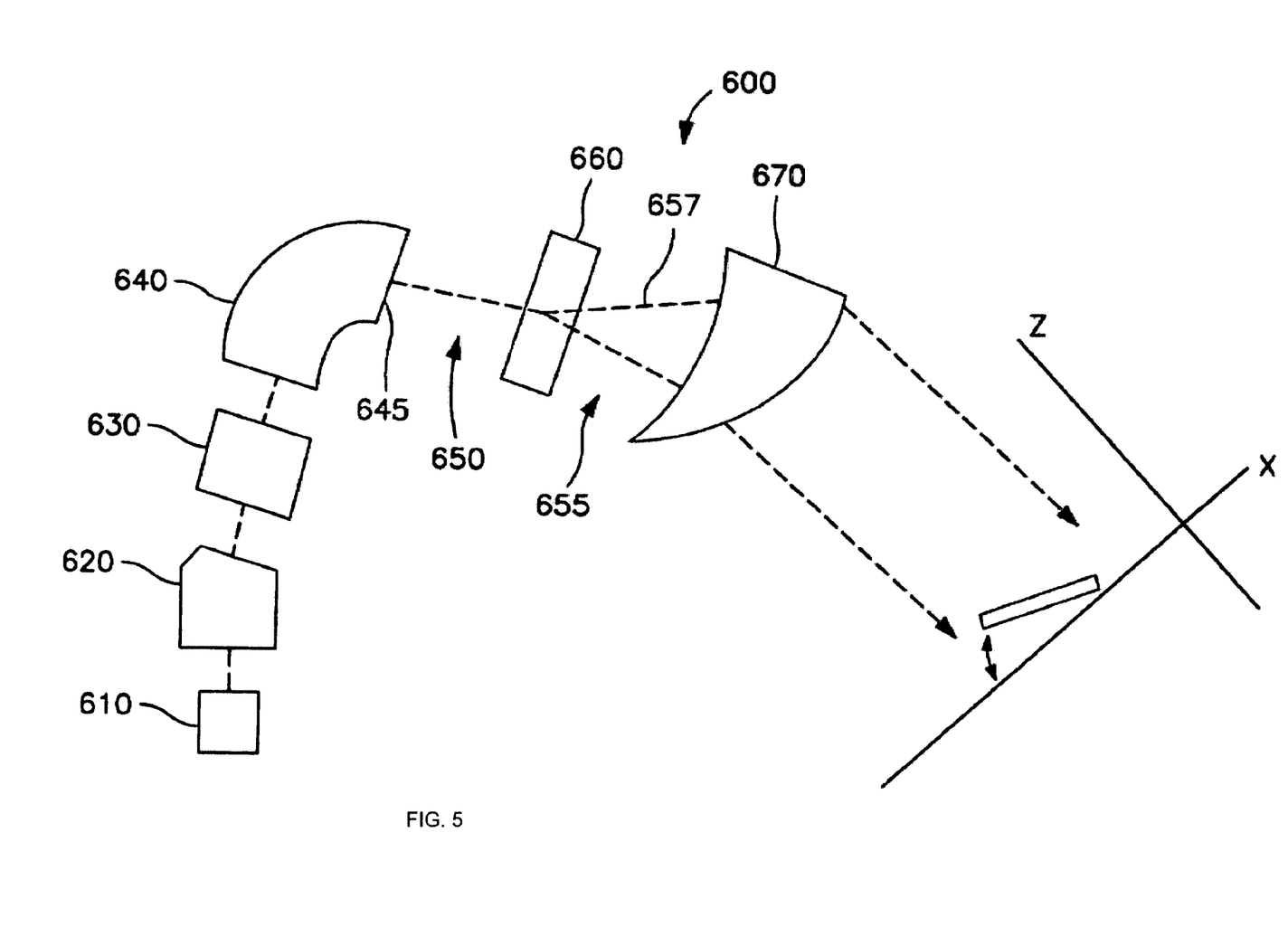
FIG. 5 shows a representative schematic diagram of an ion implanter suitable for the system used in the present disclosure.

As described above, an ion beam is used to implant ions into a workpiece, such as a semiconductor wafer. A block diagram of a representative ion implanter 600 is shown in FIG. 5. An ion source 610 generates ions of a desired species, such as arsenic or boron. These ions are formed into a beam, which then passes through a source filter 620. The source filter is preferably located near the ion source. The ions within the beam are accelerated/decelerated in column 630 to the desired energy level. A mass analyzer magnet 640, having an aperture 645, is used to remove unwanted components from the ion beam, resulting in an ion beam 650 having the desired energy and mass characteristics passing through resolving aperture 645.

In many embodiments, one or more quadrupole magnets are also included in the beam line to help shape and focus the beam. In some embodiments, a first quadrupole (Q1) magnet is located upstream of the mass analyzer magnet 640, while a second quadrupole magnet (Q2) is located downstream of the mass analyzer magnet. These magnets are typically driven by electrical coils. The current through these coils can be varied to modify the incidence angle and parallelism of the ion beam.

In certain embodiments, the ion beam 650 is a spot beam. In this scenario, the ion beam passes through a scanner 660, preferably an electrostatic scanner, which deflects the ion beam 650 to produce a scanned beam 655 wherein the individual beamlets 657 have trajectories which diverge from scan source 660. In certain embodiments, the scanner 660 comprises separated scan plates in communication with a scan generator. The scan generator creates a scan voltage waveform, such as a sine, sawtooth or triangle waveform having amplitude and frequency components, which is applied to the scan plates. In a preferred embodiment, the scanning waveform is typically very close to being a triangle wave (constant slope), so as to leave the scanned beam at every position for nearly the same amount of time. Deviations from the triangle are used to make the beam uniform. The resultant electric field causes the ion beam to diverge as shown in FIG. 5.

An angle corrector 670 is adapted to deflect the divergent ion beamlets 657 into a set of beamlets having substantially parallel trajectories. Preferably, the angle corrector 670 comprises a magnet coil and magnetic pole pieces that are spaced apart to form a gap, through which the ion beamlets pass. The coil is energized so as to create a magnetic field within the gap, which deflects the ion beamlets in accordance with the strength and direction of the applied magnetic field. The magnetic field is adjusted by varying the current through the magnet coil. Alternatively, other structures, such as parallelizing lenses, can also be utilized to perform this function.

Following the angle corrector 670, the scanned beam is targeted toward the workpiece. The workpiece is attached to a workpiece support. The workpiece support provides a variety of degrees of movement. For example, the workpiece support can be turned about a line that passes through the center of the workpiece and is parallel to any of the three major axes. Thus, by pivoting about a line parallel to the X axis, the workpiece support allows tilting of the workpiece such that the top half of the workpiece is tilted toward or away from the ion source relative to the bottom half. Similarly, by pivoting about a line parallel to the Y axis, the workpiece support allows tilting of the workpiece such that the left half of the workpiece is tilted toward or away from the ion source relative to the right half. Finally, the workpiece support allows rotation about a line perpendicular to the surface of the workpiece, so as to create a clockwise or counterclockwise movement of the workpiece surface. These movements are not mutually exclusive, the workpiece support can be manipulated in any combination of directions simultaneously. Additionally, the workpiece support also provides translational movement, typically in the Y direction, so as to expose the entire workpiece to the ion beam. As described above, the workpiece may be tilted about a line parallel to the Y axis to maximize the parallelism of the ion beamlets. This is achieved through tilting of the workpiece support as described above.

Figure 6:
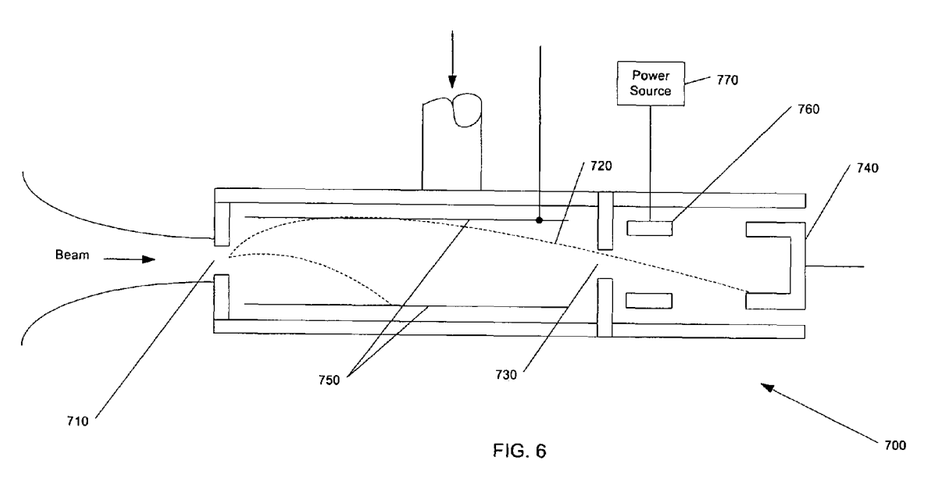
FIG. 6 shows a representative schematic of the detector used in the present disclosure.

FIG. 6 illustrates an ion beam incidence angle detector. The detector 700 has a front wall, containing a front slit 710, which has an opening s, through which the beam enters. The beam passes through a cavity 720, which has a length D, which terminates in a rear wall having a rear slit 730, also having an opening s. Located downstream of the rear slit 730 is a current collecting cup 740. Such collecting cups are known in the art and will not be further described herein.

In the cavity 720 between the front slit 710 and the rear slit 730 are one or more electrostatic deflection plates 750. These plates are preferably parallel to one another and are a distance g apart. These plates are a distance δ from the front and rear walls. In operation, an ion beam enters the cavity 720 via the front slit 710. The path of the ion beam is deflected based on the electric field generated between the deflection plates. A portion of the deflected ion beam then passes through the rear slit 730 and is captured by the collecting cup 740. The collecting cup is then used to generate a quantitative value that is in proportion to the amount of ions that were collected. Electrodes 760 suppress backstreaming electrons resulting from the ion beam striking the collecting cup 740.

Those skilled in the art will appreciate that if the electric field between the deflection plates is changed, the incoming ion beam will be deflected differently, resulting in a different reading from the collecting cup 740.

For ions passing through the rear slit 730, the angle of the incoming ion beam can be written as $$X' = \frac{V}{\Phi} * \frac{(D-2\delta)}{4g}$$

Where X' is the initial angle of the incoming ion beam, Φ is the energy of the incoming ions, V is the deflection voltage applied across the gap and D, g and δ are the dimensions of the detector as described above.

In certain embodiments, the slit opening, s, is several mils, while D is 4-5 cm and g is 2-3 mm. Other dimensions are within the scope of the disclosure and those skilled in the art may construct the detector according to their specific design constraints. Using this type of detector, it is possible to measure incoming incidence angles to within +/−0.1 degrees.

By varying the deflection voltage, it is possible to correlate the collected current to the angle of incoming ion beam. Thus, the angle of the incoming ion beam can be deduced by determining the voltage at which the maximum current is measured by the collecting cup 740.

This process is preferably performed by applying a waveform, preferably a cyclic waveform, to the deflection plates 750. For example, a sinusoidal or triangular waveform can be applied to the plates 750. As long as the frequency of the waveform is much less than the time required for an ion to travel through the cavity 720, the above equations remain valid. In some embodiments, a waveform having a period of about 1 kHz is used. In some embodiments, the applied voltage can be from 100V to several kilovolts.

Thus, assuming the scan rate in the above scenario, it is possible to obtain the angle of the incoming beam in about 1 ms. However, an average of many measurements is preferably performed to minimize statistical jitter. In one embodiment, 100 samples are taken, which allows an accurate measurement to be produced in about 100 ms.

Figure 7:
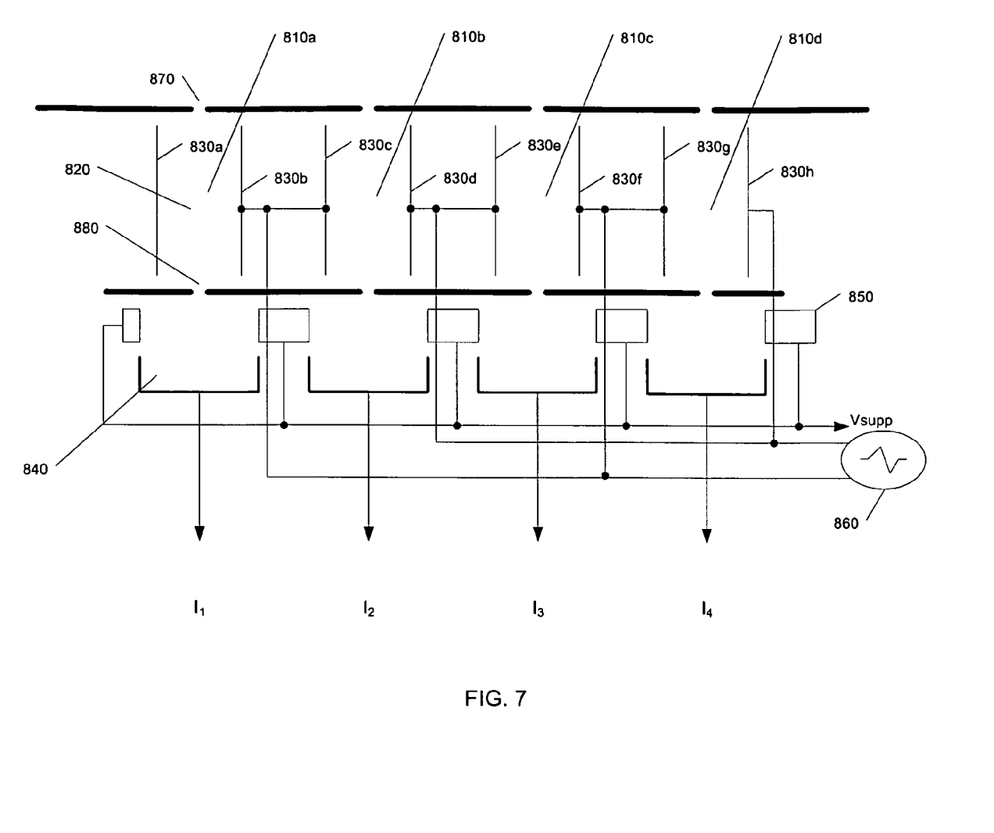
FIG. 7 shows an array of detectors.

A plurality of these detectors can then be used to determine the parameters of an entire ion beam. FIG. 7 shows an array of detectors 800 arranged adjacent to one another. In this embodiment, the ion beam is assumed to have its width in the plane of FIG. 7. Four detectors 810*a-d* are shown, which are used to measure the incident angle of the ion beam at four different locations across the ion beam. The deflection plates 830*a-h* are supplied with a triangular waveform 860, such that opposing plates receive voltages which are out of phase. Thus, plates 830*a,d,e,h* receive the same voltage, while plates 830*b,c,f,g* receive the out-of-phase voltage. In another embodiment, a plate of each set is tied to a fixed voltage, while the opposing plate receives a cyclic waveform. A fixed voltage is applied to the electrodes 850. The ion beam enters into each of the four detectors 810 via an associated front slit 870. The beamlets each pass through a respective cavity 820 and exit through the rear slit 880. That portion of the ion beam that exits the rear slit 880 is collected in the respective collecting cup 840. Each of these measured currents is then used to determine the incident angle of the ion beam at each of the detectors. Based on the values received for $I_1$, $I_2$, $I_3$ and $I_4$, it is then possible to determine the divergence and spread of the ion beam.

Figure 8:
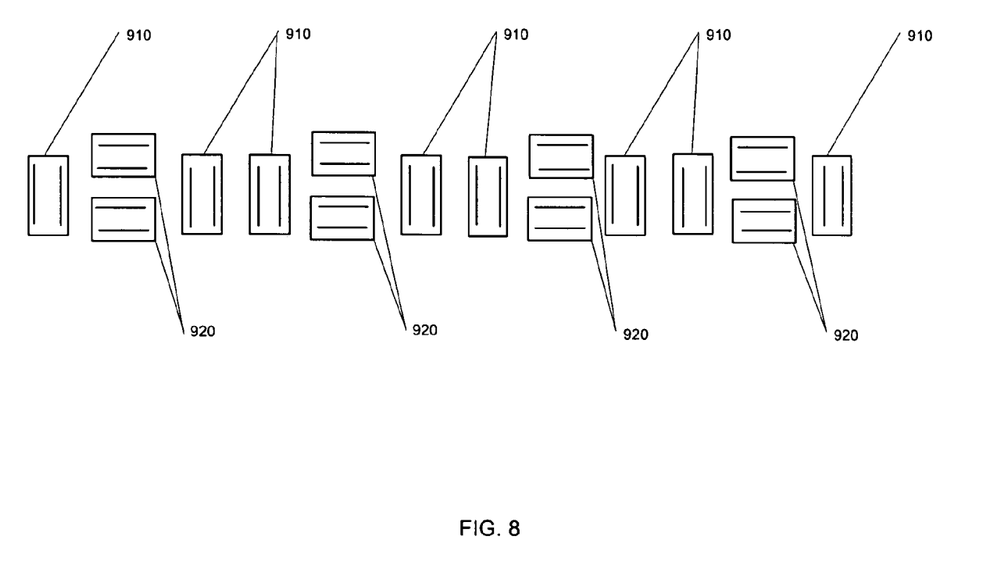
FIG. 8 shows a second embodiment of the detector array.

While FIG. 7 shows four adjacent detectors, the disclosure is not limited to this embodiment. Any number of detectors can be used to determine the divergence and spread of the ion beam. In addition, this Figure shows the detectors being used to measure the divergence and spread in the X dimension. Detectors can also be arranged so as to measure divergence and spread in the Y dimension. Additionally, the detectors can be arranged so as to simultaneously measure these characteristics in both dimensions. FIG. 8 shows a representative array of detectors that can be used to perform such a measurement. Detectors 910 are used to measure the ion beam in the X dimension, while detectors 920 measure the ion beam in the Y dimension.

To measure the ion beam, this array of detectors must be placed in the beam path. In one embodiment, the array is placed at a location behind the workpiece. In this embodiment, the beam's characteristics are measured and adjusted before the workpiece is placed in the beam's path. In such an embodiment, the array can have a fixed position, since it is downstream of the workpiece.

In another embodiment, the array is placed on a movable shaft, which can be inserted into the beam path. Referring to FIG. 5, the shaft is preferably inserted between the angle corrector 670 and the workpiece. The array is then removed from the beam path before the implantation process begins.

The measurements recorded by the detectors can be utilized in a number of ways. In the typical ion implantation system, there are a number of components that can be adjusted to vary the angle and parallelism of the resulting beam. For example, referring to FIG. 5, the mass analyzer magnet 640, the quadrupole magnets Q1 and Q2 (not shown), the scanner 660 and the angle corrector 670 can all be adjusted to vary the resulting ion beam. In some embodiments, a magnetic or electric deceleration stage, as known as D1, can be inserted following the mass analyzer magnet 640. Also, in some embodiments, a magnetic or electric deceleration stage, also known as D2, can be inserted following the angle corrector 670. Parameters, known as D1 and D2 suppression and D2 focus, can also be adjusted based on the currents measured by the collecting cups in the array.

Because of the speed at which the detectors can determine the angle of incidence, real time adjustment of the beam line components is now possible. Previously, this process could take minutes or even hours to complete.

The adjustments to the beam line components can be made in a number of ways. In one embodiment, the results of the measurements are reported to an operator. These results can be in the form of a list of the actual currents measured by each collecting cup, or in the form of processed data. These results are then used by the operator to adjust the various controls on the ion implantation system, based on previous experience and expertise.

Alternatively, the implantation system can be configured so that it calibrates itself automatically. A controller, such as a computing device, is used to control the various adjustable beam line components. This controller also has access to the currents measured by the collecting cups. By being able to control the components and view the results of any adjustment, the controller is able to tune the system for optimal beam performance.

In one embodiment, the controller determines the optimal settings for the system by empirical analysis. The controller configures the system and performs a measurement. The controller then varies one or more components and repeats the measurements. In one embodiment, the controller exhaustively tests the various settings of each adjustable component to determine the optimal settings for the entire system.

In a second embodiment, the controller utilizes one or more algorithms to reduce the number of possible system configurations needed to find the optimal setting.

Each of the previous methods utilizes a trial-and-error approach to select the proper adjustments for the beam line components. In another embodiment, the controller receives the measured currents from the array, and based on a set of algorithms, creates a set of adjustments for the various components. This process is iterated until the parameter or parameters of interest (i.e. beam spread) are within a prescribed tolerance. These adjustments can be applied to various components in the beamline, such as those described above. Such algorithms are known by those skilled in the art. One such algorithm is described in *Numerical Recipes*, W. Press, B. Flannery, S. Teukolsky, and W. Vetterling, Cambridge Univ Press, 1990.

What is claimed is:

1. An apparatus for measuring parameters of an ion beam, comprising a plurality of detectors, each of said detectors comprising:
   i. A front wall having a first opening, such that a portion of said ion beam may pass through said first opening;
   ii. A rear wall having a second opening, such that a portion of said ion beam passing through said first opening may pass through said second opening;
   iii. A cavity, defined between said front and rear walls, having one or more electrostatic deflection plates;
   iv. A current collection device positioned behind said second opening, adapted to measure the amount of said beam passing through said first and second opening; and
   v. A variable power supply in communication with said electrostatic deflection plates.

2. The apparatus of claim 1, wherein said beam has one dimension much larger than its second dimension, and wherein said plurality of detectors is arranged along said longer dimension.

3. The apparatus of claim 2, wherein each of said detectors is adapted to detect the incidence angle of said ion beam in one dimension, and all of said detectors are positioned so as to detect the incidence angle in the same direction.

4. The apparatus of claim 1, further comprising a controller, wherein said controller is in communication with the output of each of said current collection devices.

5. The apparatus of claim 4, wherein said ion beam is generated by an ion implantation system having at least one adjustable component for varying the parameters of said ion beam, wherein said controller is in communication with said adjustable component, so as to vary the parameters of said ion beam based on said output from said current collection devices.

6. The apparatus of claim 5, wherein said adjustable component is selected from the group consisting of quadrupole magnets, mass analyzer magnet, D1 focus, D1 suppression, D2 suppression, rods, poles, correction magnet, and a scanner.

7. The apparatus of claim 1, wherein said beam has one dimension much larger than its second dimension, and wherein each of said detectors is adapted to detect the incidence angle of said ion beam in one dimension, and wherein a portion of said detectors are positioned so as to detect the incidence angle in said larger direction and the remainder of said detectors are positioned so as to detect the incidence angle in the smaller dimension.

8. The apparatus of claim 1, further comprising a workpiece support onto which said ion beam is directed, wherein said plurality of detectors is positioned downstream of said workpiece support.

9. The apparatus of claim 1, further comprising a workpiece support onto which said ion beam is directed, wherein said plurality of detectors is positioned upstream of said workpiece support.

10. A method of rapidly measuring parameters of an ion beam created by a ion implantation system having at least one adjustable component for varying the parameters of said ion beam, comprising:
 a. Providing a plurality of detectors, each of said detectors comprising:
  i. A front wall having a first opening, such that a portion of said ion beam may pass through said first opening;
  ii. A rear wall having a second opening, such that a portion of said ion beam passing through said first opening may pass through said second opening;
  iii. A cavity, defined between said front and rear walls, having one or more electrostatic deflection plates;
  iv. A current collection device positioned behind said second opening, adapted to measure the amount of said beam passing through said first and second opening; and
  v. A variable power supply in communication with said electrostatic deflection plates;
 b. Varying the voltage to each of said electrostatic plates;
 c. Determining the amount of said beam reaching each of said current collection devices as a function to said voltage; and
 d. Calculating said incidence angle of the beam at each of said detectors.

11. The method of claim 10, wherein said voltage is varied cyclically.

12. The method of claim 10, wherein said beam has one dimension much larger than its second dimension, and wherein said plurality of detectors is arranged along said longer dimension.

13. The method of claim 10, wherein steps b-c are repeated a plurality of times before calculating said incidence angle.

14. A method of rapidly adjusting the parameters of an ion beam, created by an ion implantation system having at least one adjustable component for varying the parameters of said ion beam, to a desired setting, comprising:
 a. Providing a plurality of detectors, each of said detectors comprising:
  i. A front wall having a first opening, such that a portion of said ion beam may pass through said first opening;
  ii. A rear wall having a second opening, such that a portion of said ion beam passing through said first opening may pass through said second opening;
  iii. A cavity, defined between said front and rear walls, having one or more electrostatic deflection plates;
  iv. A current collection device positioned behind said second opening, adapted to measure the amount of said beam passing through said first and second opening; and
  v. A variable power supply in communication with said electrostatic deflection plates;
 b. Varying the voltage to each of said electrostatic plates;
 c. Determining the amount of said beam reaching each of said current collection devices as a function to said voltage;
 d. Calculating said incidence angle of the beam at each of said detectors;
 e. Adjusting at least one component of said ion beam generator based on said calculated incidence angles for each collector;
 f. Repeating steps b-e until said parameters are adjusted to said desired setting.

15. The method of claim 14, wherein steps b-c are performed a plurality of times prior to step d.

16. The method of claim 14, wherein said ion implantation system comprises a controller in communication with said current collection devices and said adjustable component, wherein said adjusting step is performed by said controller.

17. The method of claim 16, wherein said controller utilizes an algorithm to determine the adjustment to be made to said adjustable component based on the output of each of said current collection devices.

18. The method of claim 14, wherein said adjustable component is selected from the group consisting of quadrupole magnets, mass analyzer magnet, D1 focus, D1 suppression, D2 suppression, rods, poles, a correction magnet, and a scanner.

* * * * *